(12) United States Patent
Kim et al.

(10) Patent No.: US 9,293,731 B2
(45) Date of Patent: Mar. 22, 2016

(54) ORGANIC LIGHT EMITTING DISPLAY DEVICE AND METHOD OF MANUFACTURING THE SAME

(71) Applicant: SAMSUNG DISPLAY CO., LTD., Yongin, Gyeonggi-Do (KR)

(72) Inventors: Seung Hun Kim, Hwaseong-si (KR); Jin Koo Kang, Cheonan-si (KR); Soo Youn Kim, Siheung-si (KR); Hyun Ho Kim, Hwaseong-si (KR); Seung Yong Song, Suwon-si (KR); Cheol Jang, Uiwang-si (KR); Sang Hwan Cho, Suwon-si (KR); Chung Sock Choi, Seoul (KR); Sang Hyun Park, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/315,119

(22) Filed: Jun. 25, 2014

(65) Prior Publication Data

US 2015/0129845 A1 May 14, 2015

(30) Foreign Application Priority Data

Nov. 8, 2013 (KR) .................... 10-2013-0135590

(51) Int. Cl.
*H01L 27/32* (2006.01)
*H01L 51/52* (2006.01)
*B32B 37/12* (2006.01)

(52) U.S. Cl.
CPC ........ *H01L 51/5256* (2013.01); *B32B 37/1284* (2013.01); *H01L 27/323* (2013.01); *B32B 2457/206* (2013.01); *H01L 2251/5338* (2013.01)

(58) Field of Classification Search
CPC .................................................. H01L 27/3244
USPC ............................................. 257/40; 438/28
See application file for complete search history.

(56) References Cited

U.S. PATENT DOCUMENTS

| | | | |
|---|---|---|---|
| 7,648,925 B2 | 1/2010 | Moro et al. | |
| 2011/0090703 A1* | 4/2011 | Ishimori et al. | 362/311.02 |
| 2013/0306231 A1* | 11/2013 | Tanaka et al. | 156/247 |
| 2014/0159001 A1* | 6/2014 | Park et al. | 257/40 |

FOREIGN PATENT DOCUMENTS

| | | |
|---|---|---|
| KR | 10-0841376 B1 | 6/2008 |
| KR | 10-2010-0063292 | 6/2010 |

* cited by examiner

*Primary Examiner* — Edward Wojciechowicz
(74) *Attorney, Agent, or Firm* — Lewis Roca Rothgerber Christie LLP (57) ABSTRACT

An organic light emitting display device having a display substrate; a display element layer formed on the display substrate and including a plurality of pixels, a thin film encapsulation layer which covers and protects the display substrate and the display element layer; a function film disposed on the thin film encapsulation layer, a first adhesive layer disposed between the thin film encapsulation layer and the functional film, a window attached onto the functional film which protects the display element layer, and a second adhesive layer disposed between the functional film and the window, in which the first adhesive layer and the second adhesive are formed by deposition, a surface processing is performed, and facing surfaces are adhered with each other.

14 Claims, 7 Drawing Sheets

ORGANIC LIGHT EMITTING DISPLAY DEVICE AND METHOD OF MANUFACTURING THE SAME

CROSS-REFERENCE TO RELATED APPLICATION

This application claims priority to and the benefit of Korean Patent Application No. 10-2013-0135590, filed in the Korean Intellectual Property Office on Nov. 8, 2013, the entire content of which is incorporated herein by reference.

BACKGROUND

1. Field

The described technology relates generally to an organic light emitting display device and a method of manufacturing the same, and more particularly to an organic light emitting display device in which a functional film is attached onto a display panel and a method of manufacturing the same.

2. Description of the Related Art

An organic light emitting display device includes organic light emitting elements each of which is configured by a hole injection electrode, an organic light emitting layer, and an electron injection electrode. Each organic light emitting element emits light by energy which is generated when an excitors generated by coupling an electron and a hole in the organic light emitting layer drops from an excited state to a ground state and the organic light emitting display device displays a predetermined image using the emitted light.

The organic light emitting display device has a self-emitting characteristic and does not require a separate light source, which is different from a liquid crystal display, so that thickness and weight may be reduced. Further, the organic light emitting display device has high quality characteristics such as low power consumption, high luminance, and fast response speed and therefore draws attention as a next-generation display device.

An organic light emitting display device has a panel structure in which a driving circuit unit and an organic light emitting element are formed on a flexible substrate and are protected by a thin film encapsulation (TFE). Further, a functional film such as a polarization film (polarizer) or a touch film is attached onto the thin film encapsulation layer by an adhesive such as a resin. However, when resin is used to attach the functional film, a bending characteristic is lowered due to the increased thickness of the adhesive and a characteristic of the adhesive is changed when the adhesive is used at high temperatures or low temperatures so that it may be difficult to implement in a flexible display.

The above information disclosed in this Background section is only for enhancement of an understanding of the background of the described technology and therefore it may contain information that does not form prior art that is already known to a person of ordinary skill in the art.

SUMMARY

Embodiments of the described technology provide an organic light emitting display device in which a metal layer or inorganic layer/semiconductor material layer is used to attach a functional film onto a display panel instead of an adhesive which is formed of a resin, and a method of manufacturing the same.

An exemplary embodiment provides an organic light emitting display device including: a display substrate; a display element layer which is formed on the display substrate including a plurality of pixels; a thin film encapsulation layer which covers and protects the display substrate and the display element layer; a function film disposed on the opposite side of the thin film encapsulation layer so; a first adhesive layer disposed between the thin film encapsulation layer and the functional film; a window which is attached onto the functional film which protects the display element layer; and a second adhesive layer is disposed between the functional film and the window, in which the first adhesive layer and the second adhesive are formed such that after forming the first adhesive layer and the second adhesive layer on the thin film encapsulation layer and the functional film, the functional film and the window are formed by deposition, a surface processing is performed and facing surfaces are adhered to each other.

The first adhesive layer and the second adhesive layer may be metal layers or inorganic layers/semiconductor material layers.

The metal layer may be formed of any one metal of Al, Cu, Ag, Au, Sn, In, Ti, and Ni.

The inorganic layer/semiconductor material layer may be formed of any one material of SiC, SiNx, AlOx, and AlN.

The deposition may be performed by any one of a sputtering method, an evaporation method, a chemical vapor deposition method (CVD), and an atomic layer deposition method (ALD).

The surface processing may be performed by any one method of a plasma processing, an atomic beam processing, a heating processing, and a vacuum processing onto the deposited first adhesive layer and second adhesive layer.

The functional film may include a polarization film and a touch film which is attached onto the polarization film.

The organic light emitting display device may further include a third adhesive layer which is deposited between the polarization film and the touch film.

The third adhesive layer may be a metal layer or an inorganic layer/semiconductor material layer.

The metal layer may be formed of any one metal of Al, Cu, Ag, Au, Sn, In, Ti, and Ni.

The inorganic layer/semiconductor material layer may be formed of any one material of SiC, SiNx, AlOx, and AlN.

The organic light emitting display device may further include a protective film which is disposed so as to be opposite to the display substrate; and, a fourth adhesive layer which is disposed between the display substrate and the protective film. The fourth adhesive layer may be formed by adhering the display substrate and the protective film after forming the fourth adhesive layer on the display substrate by deposition and the protective film by deposition and then performing a surface processing.

The fourth adhesive layer may be a metal layer or an inorganic layer/semiconductor material layer.

The metal layer may be formed of any one metal of Al, Cu, Ag, Au, Sn, In, Ti, and Ni.

The inorganic layer/semiconductor material layer may be formed of any one material of SiC, SiNx, AlOx, and AlN.

Another exemplary embodiment provides a manufacturing method of an organic light emitting display device including: a display panel preparing step of preparing a display panel which includes a display substrate, a display element layer which is formed on the display substrate and includes a plurality of pixels, and a thin film encapsulation layer which covers and protects the display substrate and the display element layer; a first adhesive layer deposition step of forming a first adhesive layer on the thin film encapsulation layer of the display panel and a first adhesive layer on a functional film which is disposed opposite the thin film encapsulation layer; a first surface processing step of performing a surface processing on the first adhesive layer; and an adhering step of bringing the first adhesive layers into contact with each other to adhere the thin film encapsulation layer and the functional film.

The manufacturing method may further include a second adhesive layer deposition step of forming a second adhesive layer on the functional film and a second adhesive layer on a window which is disposed opposite to the functional film; a second surface processing step of performing a surface processing on the second adhesive layer; and a second adhering step of bringing the second adhesive layers into contact with each other to adhere the functional film and the window.

The functional film may include a polarization film and a touch film which is formed on the polarization film and the functional film may be manufactured by including: a third adhesive layer forming step of forming a third adhesive layer on the polarization film and a third adhesive layer on the touch film which is disposed opposite to the polarization film; a third surface processing step of performing a surface processing on the third adhesive layer; and a third adhering step of bringing the third adhesive layers into contact with each other to adhere the polarization film and the touch film.

The manufacturing method may further include a fourth adhesive layer deposition step of forming a fourth adhesive layer on the display substrate and a fourth adhesive layer on the protective film which is disposed opposite to the display substrate; a fourth surface processing step of performing a surface processing on the fourth adhesive layer; and a fourth adhering step of bringing the fourth adhesive layers into contact with each other to adhere the display substrate and the protective film.

According to exemplary embodiments, when the functional film is attached onto the display panel, a metal layer or an inorganic layer/semiconductor material layer is used instead of an adhesive which is formed of a resin, so that a slim organic light emitting display device may be achieved, a bending characteristic may be improved, and a high temperature/low temperature characteristic may be improved.

A moisture permeability characteristic of a metal layer or an inorganic layer/semiconductor material layer is improved over an inorganic layer, which when applied to a thin film encapsulation layer may simplify a structure and reduce cost.

DETAILED DESCRIPTION

Hereinafter, the present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

Further, in exemplary embodiments, since like reference numerals designate like elements having the same configuration, an exemplary embodiment is representatively described, and in other exemplary embodiments, only a configuration different from the exemplary embodiment will be described.

It should be understood that drawings are schematically illustrated but are not illustrated to scale. A relative size and a ratio of a part in the drawing are exaggerated or reduced for clarity and convenience and an arbitrary size may be illustrative but the present invention is not limited thereto. Further, the same reference numeral designates the same structure, element, or component illustrated in two or more drawings to indicate similar characteristics. It will be understood that that when a layer is referred to as being "on" or "above" another layer or substrate, it can be directly on the other layer or substrate, or intervening layers may also be present.

Exemplary embodiments may specifically describe an exemplary embodiment. As a result, numerous variations of drawings are expected. Therefore, the exemplary embodiments are not limited to a specific type of an illustrated region, and for example, a modification by manufacturing is also included.

Hereinafter, an organic light emitting display device according to an exemplary embodiment will be described with reference to FIGS. 1 and 2.

Figure 1:
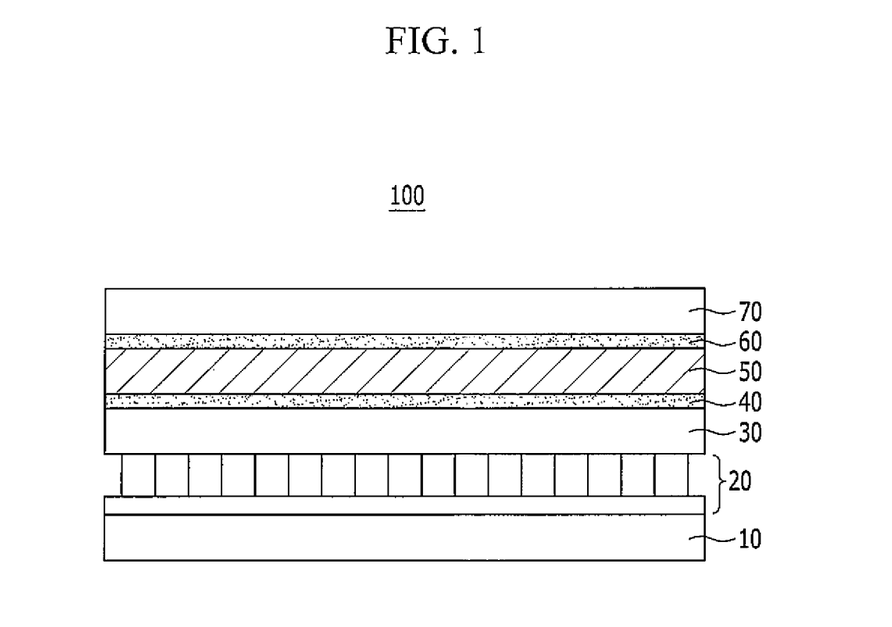
FIG. 1 is a cross-sectional view schematically illustrating an organic light emitting display device according to an exemplary embodiment.
Figure 2:
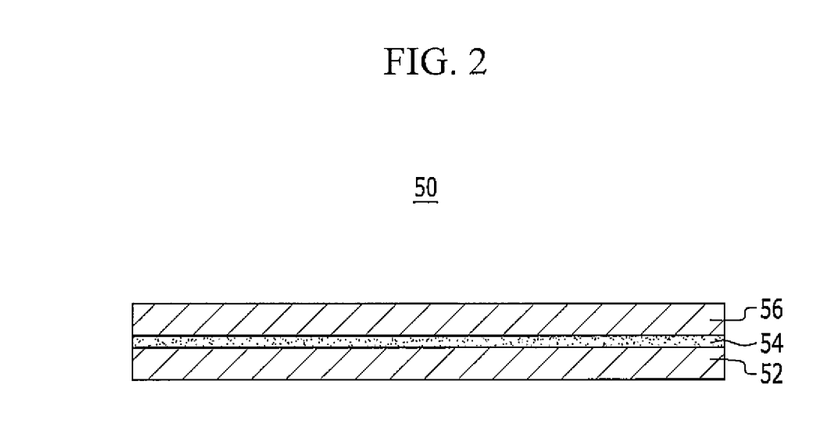
FIG. 2 is a cross-sectional view schematically illustrating a functional film according to an exemplary embodiment.

FIG. 1 is a cross-sectional view schematically illustrating an organic light emitting display device according to an exemplary embodiment and FIG. 2 is a cross-sectional view schematically illustrating a functional film according to an exemplary embodiment.

Referring to FIG. 1, an organic light emitting display device 100 includes a display substrate 10, a display element layer 20 which is formed on the display substrate 10 and includes a plurality of pixels, a thin film encapsulation layer 30 which covers and protects the display substrate 10 and the display element layer 20, a functional film 50 which is disposed on the thin film encapsulation layer 30 so as to be opposite to the thin film encapsulation layer 30, and a window 70 which is attached onto the functional film 50 and protects the display element layer 20.

The display substrate 10 may be formed of a flexible plastic material but is not limited thereto. Further, the display substrate 10 may be formed of a metallic substrate which is formed of stainless steel or other various flexible materials may be used therefor. The display substrate 10 may be formed of a plastic material having excellent heat resistance and durability, such as polyethylene ether phthalate, polyethylene naphthalate, polycarbonate, polyarylate, polyetherimide, polyether sulfone, and polyimide.

The display element layer 20 may include a driving circuit unit and an organic light emitting element which are formed on the display substrate 10. The driving circuit unit includes a thin film transistor and drives the organic light emitting element. The organic light emitting element is connected to the driving circuit unit to emit light in accordance with a driving signal transmitted from the driving circuit unit to display an image. The organic light emitting element and the driving circuit unit may be formed to have various structures within a scope in which the present invention may be easily modified and embodied by those skilled in the art.

The thin film encapsulation layer 30 covers the display substrate 10 and the display element layer 20 to protect the display substrate 10 and the display element layer 20 and at least one organic layer and at least one inorganic layer are alternately laminated therein. There may be a plurality of inorganic layers or organic layers. The organic layer is formed of a polymer and may be a single layer or a laminated layer which is formed of any one of polyethylene terephthalate, polyimide, polycarbonate, epoxy, polyethylene, and polyacrylate. The organic layer may be formed of polyacrylate and specifically includes a polymerized monomer composition which includes a diacrylate based monomer and a triacrylate based monomer. The monomer composition may further include a mono acrylate based monomer. Further, the monomer composition may further include a known photo initiator such as TPO (2,4,6-trimethylbenzoyl diphenyl phosphoine), but is not limited thereto.

The inorganic layer may be a single layer or a laminated layer including metal oxide or metal nitride. Specifically, the inorganic layer may include any one of $SiN_x$, $Al_2O_3$, $SiO_2$, and $TiO_2$.

A top surface which is exposed to the outside among layers which form the thin film encapsulation layer 30 may be formed of an inorganic layer in order to prevent moisture from permeating into the organic light emitting element.

The thin film encapsulation layer 30 may include at least one sandwich structure in which at least one organic layer is interposed between at least two inorganic layers. Further, the thin film encapsulation layer 30 may include at least one sandwich structure in which at least one inorganic layer is interposed between at least two organic layers.

The thin film encapsulation layer 30 may sequentially include a first inorganic layer, a first organic layer, and a second inorganic layer from a top portion of the organic light emitting element layer. Further, the thin film encapsulation layer 30 may sequentially include a first inorganic layer, a first organic layer, a second inorganic layer, a second organic layer, and a third inorganic layer from the top portion of the organic light emitting element layer. Further, the thin film encapsulation layer 30 may sequentially include a first inorganic layer, a first organic layer, a second inorganic layer, a second organic layer, a third inorganic layer, a third organic layer, and a fourth inorganic layer from the top portion of the organic light emitting element layer.

A halide metal layer which includes lithium fluoride (LiF) may be further provided between the organic light emitting element layer and the first inorganic layer. The halide metal layer may prevent damage of the organic light emitting element layer generated when the first inorganic layer is formed by a sputtering method or a plasma deposition method.

An area of the first organic layer may be narrower than an area of the second inorganic layer and an area of the second organic layer may be narrower than an area of the third inorganic layer. Further, the first organic layer may be formed to be entirely covered by the second inorganic layer and the second organic layer may also be entirely covered by the third inorganic layer.

A first adhesive layer 40 is disposed between the thin film encapsulation layer 30 and the functional film 50 to attach the thin film encapsulation layer 30 and the functional film 50 to each other. Further, a second adhesive layer 60 is disposed between the functional film 50 and the window 70 to attach the functional film 50 and the window 70 to each other.

The first adhesive layer 40 is formed such that, after forming the first adhesive layer 40 on the thin film encapsulation layer 30 and the functional film 50 by deposition, a surface processing is performed thereon to adhere facing surfaces to each other. Further, the second adhesive layer 60 is formed such that after forming the second adhesive layer 60 on the functional film 50 and the window 70 by deposition, a surface processing is performed thereon to adhere facing surfaces to each other.

The first adhesive layer 40 and the second adhesive layer 60 may be a metal layer or inorganic layer/semiconductor material layer. In this case, the metal layer may be formed of any one of metals including Al, Cu, Ag, Au, Sn, In, Ti, and Ni. Further, the inorganic layer/semiconductor material layer may be formed of any one of materials including SiC, SiNx, AlOx, and AlN.

The deposition method may be performed by a sputtering method, an evaporation method, a chemical vapor deposition method, and an atomic layer deposition method.

After performing deposition, surfaces of the first adhesive layer 40 and the second adhesive layer 60 may be processed by tplasma processing, an atomic beam processing, a heating processing, and a vacuum processing.

Referring to FIG. 2, the functional film 50 may include a polarization film 52 and a touch film 56 which is attached on the polarization film 52. Further, the polarization film 52 and the touch film 56 may be attached by the third adhesive layer 54.

The third adhesive layer 54 may be a metal layer or an inorganic layer/semiconductor material layer, which is similar to the first adhesive layer 40 and the second adhesive layer 60. The metal layer may be formed of any one of metals including Al, Cu, Ag, Au, Sn, In, Ti, and Ni and the inorganic layer/semiconductor material layer may be formed of any one of materials including SiC, SiNx, AlOx, and AlN.

Figure 3:
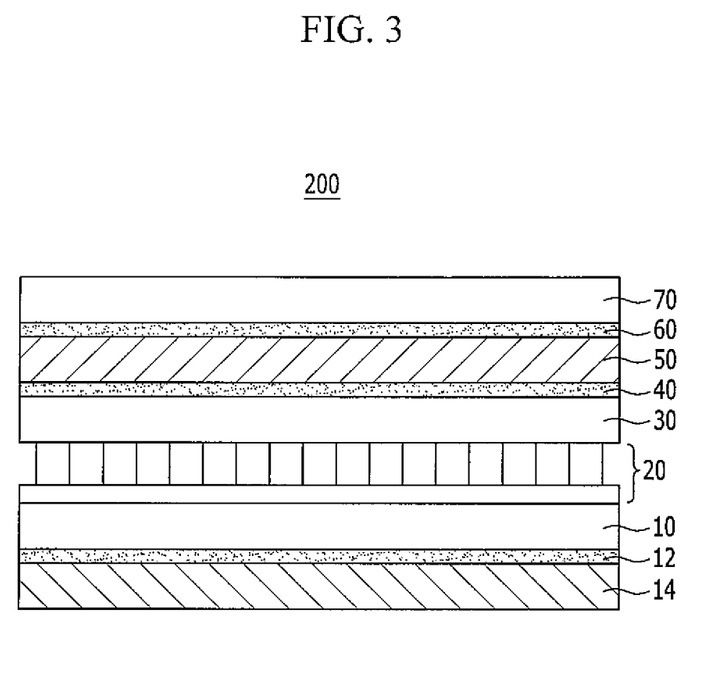
FIG. 3 is a cross-sectional view schematically illustrating an organic light emitting display device according to another exemplary embodiment.

FIG. 3 is a cross-sectional view schematically illustrating an organic light emitting display device according to another exemplary embodiment.

Referring to FIG. 3, an organic light emitting display device 200 according to the exemplary embodiment further includes a protective film 14 which is disposed on a display substrate 10 so as to face the display element layer 20 on an opposite surface of the display substrate 10 on which a display element layer 20 is formed. A fourth adhesive layer 12 is disposed between the display substrate 10 and the protective film 14.

The fourth adhesive layer 12 is formed such that after forming the fourth adhesive layer 12 on the display substrate 10 and the protective film 14 by deposition, a surface processing is performed on the deposited fourth adhesive layer 12 to adhere the display substrate 10 and the protective film 14.

The fourth adhesive layer 12 may be formed of a metal layer or inorganic layer/semiconductor material layer, which is similar to the first adhesive layer 40, the second adhesive layer 60, and the third adhesive layer 54.

In this embodiment, the metal layer may be formed of any one of metals including Al, Cu, Ag, Au, Sn, In, Ti, and Ni and the inorganic layer/semiconductor material layer may be formed of any one of materials including SiC, SiNx, AlOx, and AlN.

Figure 4:
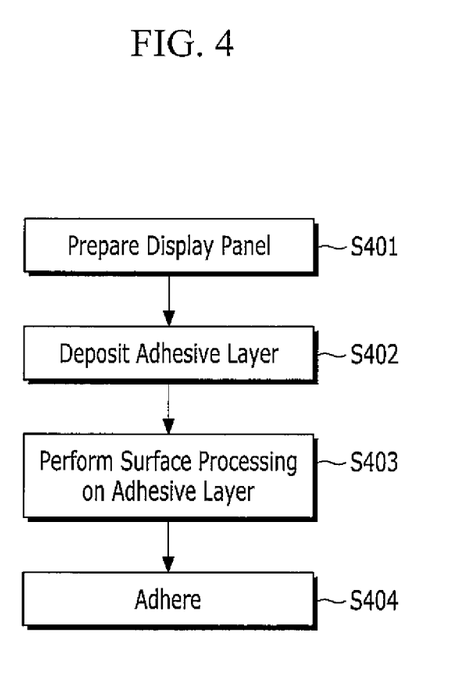
FIG. 4 is a flowchart of a manufacturing method of an organic light emitting display device according to an exemplary embodiment.
Figure 5A:
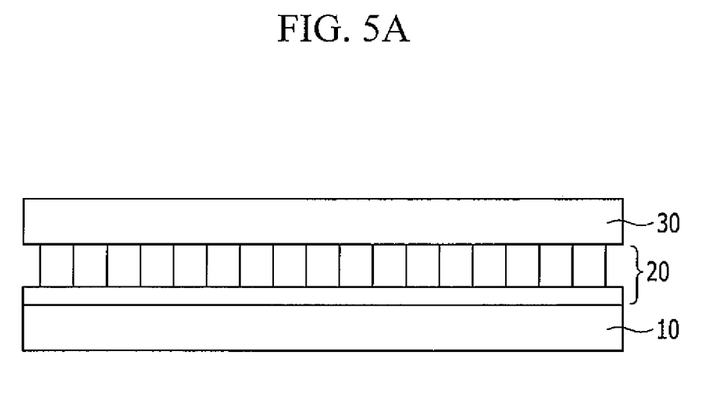
FIGS. 5A to 5C are cross-sectional views of a process illustrating a manufacturing method of an organic light emitting display device according to an exemplary embodiment.
Figure 5B:
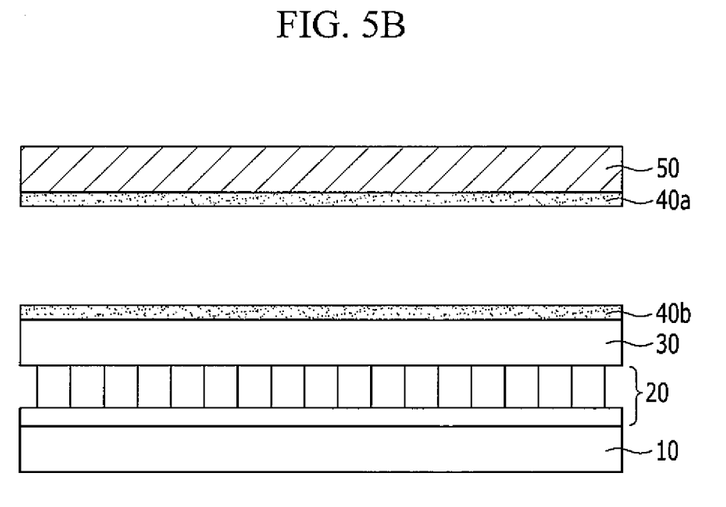
Figure 5C:
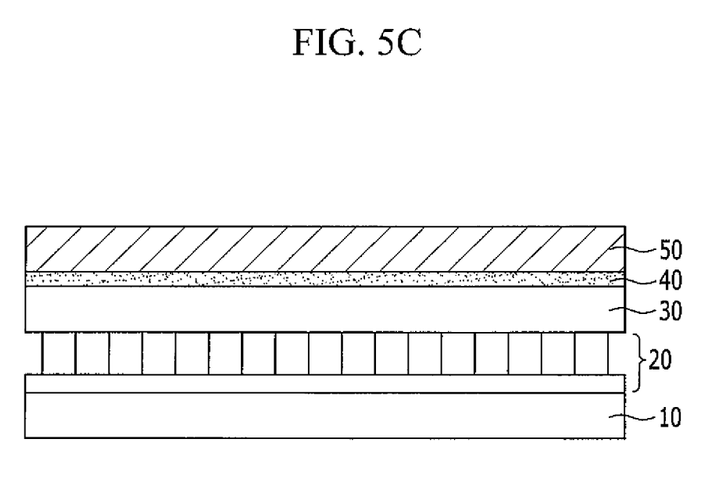

FIG. 4 is a flowchart of a manufacturing method of an organic light emitting display device according to an exemplary embodiment and FIGS. 5A to 5C are cross-sectional views of a process illustrating a manufacturing method of an organic light emitting display device according to an exemplary embodiment.

Referring to FIGS. 4 and 5A to 5C, in a manufacturing method of an organic light emitting display device according to an exemplary embodiment, first, a display panel (FIG. 5A) is prepared in step S401. The display panel includes a display substrate 10, a display element layer 20 which is formed on the display substrate 10 and includes a plurality of pixels, and a thin film encapsulation layer 30 which covers and protects the display substrate 10 and the display element layer 20.

Thereafter, first adhesive layer parts 40a and 40b of the first adhesive layer 40 are deposited and a surface processing is performed (FIG. 5B)on the first adhesive layer parts 40a and 40b in steps S402 and S403. The first adhesive layer parts 40a and 40b are deposited onto the thin film encapsulation layer 30 of the display panel and also deposited on a functional film 50 which is disposed to oppose (e.g., to be opposite to) the thin film encapsulation layer 30, respectively. In this embodiment, the deposition may be performed by any one of a sputtering method, an evaporation method, a chemical vapor deposition method, and an atomic layer deposition method. The surfaces of the deposited first adhesive layers 40a and 40b may be processed by any one of a plasma processing method, an atomic beam processing method, a heating processing method, and a vacuum processing method.

Thereafter, the surface-processed first adhesive layer parts 40a and 40b are in contact with each other (FIG. 5C) to adhere the thin film encapsulation layer 30 with the functional film 50 in step S404. In this embodiment, the first adhesive layer 40 may be formed to be a very thin layer having a thickness of several angstroms (Å) to 1 μm or less.

Figure 7:
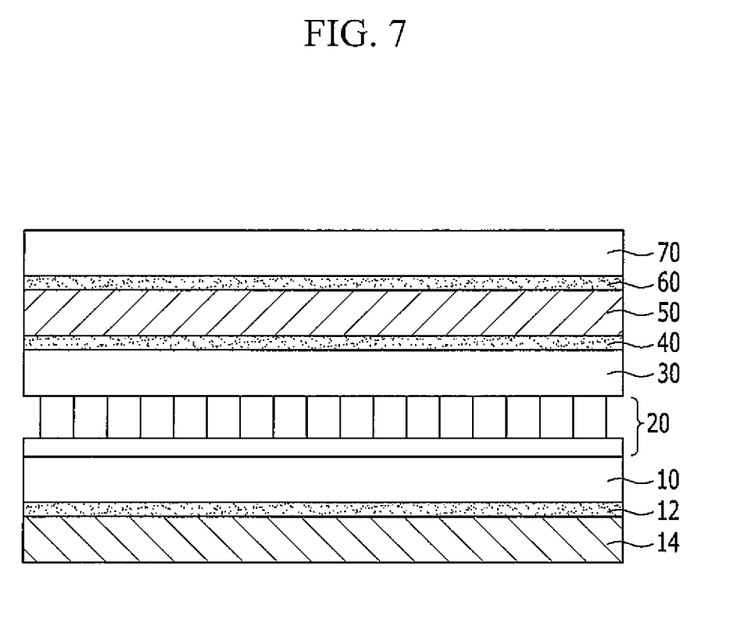
FIG. 7 is a cross-sectional view illustrating an organic light emitting display device manufactured by a manufacturing method of an organic light emitting display device according to still another exemplary embodiment.

The manufacturing method of an organic light emitting display device according to the exemplary embodiment further includes a second adhesive layer deposition step in which a part of a second adhesive layer 60 is formed on the functional film 50 by deposition and another part of the second adhesive layer 60 is formed on a window 70 which is disposed on the functional film 50 so as to oppose (e.g., to be opposite to) the functional film 50, by deposition as shown in FIG. 7. A second surface processing step in which a surface processing is performed, and a second adhesion step in which the parts of the second adhesive layers 60 are in contact with each other to adhere the functional film 50 with the window 70. The organic light emitting display device may be manufactured to have a structure illustrated in a cross-sectional view of FIG. 7.

In this embodiment, similarly to the first adhesive layer 40, the deposition of the second adhesive layer 60 may be performed by any one of a sputtering method, an evaporation method, a chemical vapor deposition method, and an atomic layer deposition method and the surfaces of the deposited second adhesive layers 60 may be processed by any one of a plasma processing method, an atomic beam processing method, a heating processing method, and a vacuum processing method.

Figure 6:
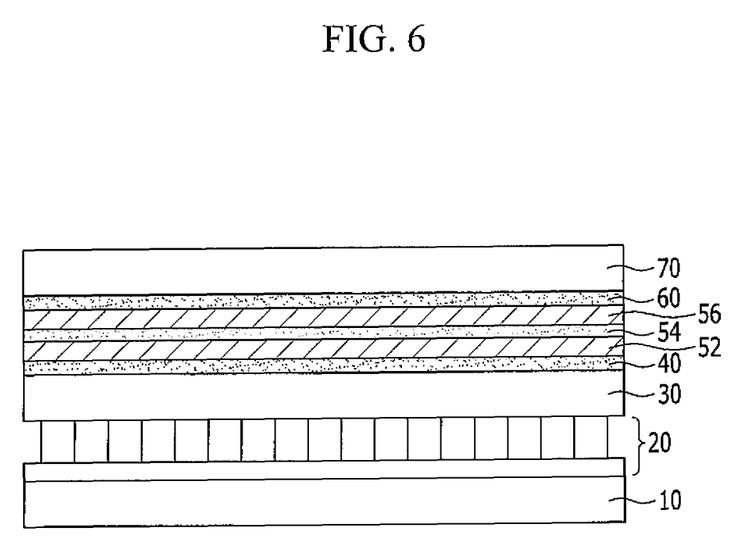
FIG. 6 is a cross-sectional view illustrating an organic light emitting display device manufactured by a manufacturing method of an organic light emitting display device according to another exemplary embodiment.

As illustrated in FIG. 6, the functional film 50 may include a polarization film 52 and a touch film 56 which is formed on the polarization film 52, the functional film 50 may be manufactured by including a third adhesive layer forming step in which a part of a third adhesive layer 54 is formed on the polarization film 52 by deposition and another part of the third adhesive layer 54 is formed on the touch film 56 which is disposed on the polarization film 52 so as to oppose (e.g., to be opposite to) the polarization film 52 by deposition. A third surface processing step occurs in which a surface processing is performed on the third adhesive layer 54, and a third adhesion step occurs in which the parts of the third adhesive layer 54 are in contact with each other to adhere the polarization film 52 with the touch film 56.

In this embodiment, similarly to the first adhesive layer 40 and the second adhesive layer 60, the deposition of the third adhesive layer 54 may be performed by any one of a sputtering method, an evaporation method, a chemical vapor deposition method, and an atomic layer deposition method and the surfaces of the deposited third adhesive layers 54 may be processed by any one of a plasma processing method, an atomic beam processing method, a heating processing method, and a vacuum processing method.

A manufacturing method of an organic light emitting display device according to another exemplary embodiment as shown in FIG. 7 further includes a fourth adhesive layer deposition step in which a part of a fourth adhesive layer 12 is formed on an opposite surface of a display substrate 10 on which a display element layer 20 is formed. Another part of the fourth adhesive layer 12 is also formed on a protective film 14 which is disposed to oppose (e.g., to be opposite to) the display substrate 10 by deposition and a fourth surface processing step occurs in which surface processing is performed. A fourth adhesion step occurs in which parts of the fourth adhesive layer 12 are in contact with each other to adhere the display substrate 10 with the protective film so that the organic light emitting display device may be manufactured to have a structure illustrated in the cross-sectional view of FIG. 7.

In this embodiment, similarly to the first adhesive layer 40, the second adhesive layer 60, and the third adhesive layer 54, the deposition of the fourth adhesive layer 12 may be performed by any one of a sputtering method, an evaporation method, a chemical vapor deposition method, and an atomic layer deposition method and the surfaces of the deposited fourth adhesive layers 12 may be processed by any one of a plasma processing method, an atomic beam processing method, a heating processing method, and a vacuum processing method.

As described above, when a functional film such as a polarization film or a touch film is attached onto a display panel by a manufacturing method of an organic light emitting display device according to the exemplary embodiments, a metal layer or an inorganic layer/semiconductor material layer is used as an adhesive instead of using a resin, so that a slim organic light emitting display device may be achieved and a bending characteristic and a high temperature/low temperature characteristic may be improved.

Further, moisture permeability of the metal layer or the inorganic layer/semiconductor material layer is improved so as to replace an inorganic layer which is applied for the thin film encapsulation layer. Therefore, construction may be simplified and cost may be reduced.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

| Description of symbols | |
|---|---|
| 100, 200: Organic light emitting display device | 10: Display substrate |
| 12: Fourth adhesive layer | 14: Protective film |
| 20: Display element layer | 30: Thin film encapsulation layer |
| 40, 40a, 40b: First adhesive layer | 50: Functional film |

| Description of symbols | |
|---|---|
| 52: Polarization film | 54: Third adhesive layer |
| 56: Touch film | 60: Second adhesive layer |
| 70: Window | |

What is claimed is:

1. An organic light emitting display device, comprising:
a display substrate;
a display element layer on the display substrate and comprising a plurality of pixels;
a thin film encapsulation layer covering and protecting the display substrate and the display element layer;
a functional film on the thin film encapsulation layer, the thin film encapsulation layer being between the display element layer and the functional film;
a first adhesive layer between the thin film encapsulation layer and the functional film;
a window attached onto the functional film and protecting the display element layer; and
a second adhesive layer between the functional film and the window,
wherein the functional film includes:
a polarization film; and
a touch film attached onto the polarization film.

2. The organic light emitting display device of claim 1, wherein:
the first adhesive layer and the second adhesive layer are each either a metal layer or an inorganic layer/semiconductor material layer.

3. The organic light emitting display device of claim 2, wherein:
the metal layer is formed of any one metal of Al, Cu, Ag, Au, Sn, In, Ti, and Ni.

4. The organic light emitting display device of claim 2, wherein:
the inorganic layer/semiconductor material layer is formed of any one of SiC, SiNx, AlOx, and AlN.

5. The organic light emitting display device of claim 1, wherein:
the first adhesive layer is deposited by any one of a sputtering method, an evaporation method, a chemical vapor deposition method (CVD), and an atomic layer deposition method (ALD).

6. The organic light emitting display device of claim 5, wherein:
the first adhesive layer is surface processed by any one method of a plasma processing, an atomic beam processing, a heating processing, and a vacuum processing onto the deposited first adhesive layer and second adhesive layer.

7. The organic light emitting display device of claim 1, further comprising:
a third adhesive layer between the polarization film and the touch film.

8. The organic light emitting display device of claim 7, wherein:
the third adhesive layer is a metal layer or an inorganic layer/semiconductor material layer.

9. The organic light emitting display device of claim 8, wherein:
the metal layer is formed of any one metal of Al, Cu, Ag, Au, Sn, In, Ti, and Ni.

10. The organic light emitting display device of claim 8, wherein:
the inorganic layer/semiconductor material layer is formed of any one of SiC, SiNx, AlOx, and AlN.

11. The organic light emitting display device of claim 1, further comprising:
a protective film on the display substrate, the display substrate being between the display element layer and the protective film; and
a fourth adhesive layer between the display substrate and the protective film,
wherein after the fourth adhesive layer is formed by deposition on the display substrate and the protective film, a surface processing is performed to adhere the display substrate and the protective film.

12. The organic light emitting display device of claim 11, wherein:
the fourth adhesive layer is a metal layer or an inorganic layer/semiconductor material layer.

13. The organic light emitting display device of claim 12, wherein:
the metal layer is formed of any one metal of Al, Cu, Ag, Au, Sn, In, Ti, and Ni.

14. The organic light emitting display device of claim 12, wherein:
the inorganic layer/semiconductor material layer is formed of any one of SiC, SiNx, AlOx, and AlN.

* * * * *